US008430255B2

(12) United States Patent
Candler

(10) Patent No.: US 8,430,255 B2
(45) Date of Patent: Apr. 30, 2013

(54) METHOD OF ACCURATELY SPACING Z-AXIS ELECTRODE

(75) Inventor: Robert N. Candler, Los Angeles, CA (US)

(73) Assignee: Robert Bosch GmbH, Stuttgart (DE)

( * ) Notice: Subject to any disclaimer, the term of this patent is extended or adjusted under 35 U.S.C. 154(b) by 923 days.

(21) Appl. No.: 12/407,584

(22) Filed: Mar. 19, 2009

(65) Prior Publication Data

US 2010/0237039 A1    Sep. 23, 2010

(51) Int. Cl.
*C23F 1/02*    (2006.01)

(52) U.S. Cl.
USPC ............ 215/17; 216/20; 216/39; 216/56

(58) Field of Classification Search ........ 216/17, 216/20, 39, 56
See application file for complete search history.

(56) References Cited

U.S. PATENT DOCUMENTS

| | | | |
|---|---|---|---|
| 6,146,917 A | 11/2000 | Zhang et al. | |
| 6,307,169 B1 | 10/2001 | Sun et al. | |
| 6,307,815 B1 | 10/2001 | Polosky et al. | |
| 6,352,935 B1 | 3/2002 | Collins et al. | |
| 6,477,901 B1 | 11/2002 | Tadigadapa et al. | |
| 6,507,082 B2 | 1/2003 | Thomas | |
| 6,718,605 B2 | 4/2004 | Yazdi et al. | |
| 6,943,448 B2 | 9/2005 | Gabriel et al. | |
| 7,004,028 B2 | 2/2006 | Park et al. | |
| 7,045,459 B2 | 5/2006 | Freidhoff | |
| 7,153,717 B2 | 12/2006 | Carley et al. | |
| 7,172,917 B2 | 2/2007 | Partridge et al. | |
| 2004/0053434 A1* | 3/2004 | Bruner | 438/52 |
| 2004/0209435 A1* | 10/2004 | Partridge et al. | 438/381 |
| 2005/0170656 A1 | 8/2005 | Nasiri et al. | |
| 2006/0177950 A1 | 8/2006 | Lin | |
| 2007/0023851 A1 | 2/2007 | Hartzell et al. | |
| 2007/0114623 A1 | 5/2007 | Kuisma | |
| 2009/0179286 A1* | 7/2009 | Schoen et al. | 257/415 |

FOREIGN PATENT DOCUMENTS

| | | |
|---|---|---|
| JP | 2009252672 A | 10/2009 |
| WO | 03020946 A2 | 3/2003 |
| WO | 2004032320 A1 | 4/2004 |

OTHER PUBLICATIONS

Merriam-Webster, Definition of "Top", via http://www.merriam-webster.com/dictionary/top ; pp. 1-5, 2012.*
Rob N Candler et al: "Long-Term and Accelerated Life Testing of a Novel Single-Wafer Vacuum Encapsulation for MEMS Resonators", Journal of Microelectromechanical Systems, IEEE Service Center, Piscataway, NJ, US, vol. 15, No. 6, Dec. 1, 2006, pp. 1446-1456, XP011151335, ISSN: 1057-7157, (11 pages).
International Search Report in PCT application No. PCT/US2010/026664, mailed Jan. 25, 2011 (4 pages).

* cited by examiner

*Primary Examiner* — Binh X Tran
(74) *Attorney, Agent, or Firm* — Maginot, Moore & Beck

(57) ABSTRACT

A method of forming a device with a controlled electrode gap width includes providing a substrate, forming a functional layer on top of a surface of the substrate, forming a sacrificial layer above the functional layer, exposing a first portion of the functional layer through the sacrificial layer, forming a first spacer layer on the exposed first portion of the functional layer, forming an encapsulation layer above the first spacer layer, and vapor etching the encapsulated first spacer layer to form a first gap between the functional layer and the encapsulation layer.

20 Claims, 4 Drawing Sheets

METHOD OF ACCURATELY SPACING Z-AXIS ELECTRODE

FIELD OF THE INVENTION

This invention relates to fabrication processes for semiconductor devices.

BACKGROUND

Microelectromechanical systems (MEMS), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

The mechanical structures in MEMS devices are typically sealed in a chamber. The delicate mechanical structure may be sealed in, for example, a hermetically sealed metal container (for example, a TO-8 "can" as described in U.S. Pat. No. 6,307,815) or bonded to a semiconductor or glass-like substrate having a chamber to house, accommodate or cover the mechanical structure (see, for example, U.S. Pat. Nos. 6,146,917; 6,352,935; 6,477,901; and 6,507,082). In the context of the hermetically sealed metal container, the substrate on, or in which, the mechanical structure resides may be disposed in and affixed to the metal container. The hermetically sealed metal container also serves as a primary package as well.

In the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact. The two bonded substrates may or may not be the primary package for the MEMS as well.

The sensitivity of a particular device is a function of the spacing between the electrodes in a device and the device element. A typical gap between the electrode and the device element may be on the order of 1 micron to 10 microns. Provision of a small gap is desired to increase the performance capability of the device. By way of example, the sensitivity of a particular device is proportional to $1/d^2$ wherein d is the width of the gap. Additionally, the power and voltage requirements for electrostatic actuation of the device are proportional to $d^2$.

What is needed is a method of forming wafers such that the electrode spacing can be accurately determined. A further need exists for such a method which does not significantly increase the cost of producing the wafer. Yet another need exists for such a method which improves the antistiction performance of the device.

SUMMARY

In accordance with one embodiment of the present invention, there is provided a method of forming a device with a controlled electrode gap width including providing a substrate, forming a functional layer on top of a surface of the substrate, forming a sacrificial layer above the functional layer, exposing a first portion of the functional layer through the sacrificial layer, forming a first spacer layer on the exposed first portion of the functional layer, forming an encapsulation layer above the first spacer layer, and vapor etching the encapsulated first spacer layer to form a first gap between the functional layer and the encapsulation layer.

In accordance with a further embodiment, a method of forming a device with a z-axis electrode includes providing a substrate, forming a functional layer on top of a surface of the substrate, forming a sacrificial layer above the functional layer, etching a first electrode hole in the sacrificial layer, forming a first spacer layer within the first electrode hole, forming a first encapsulation layer portion above the sacrificial layer and above the first spacer layer, and removing the encapsulated first spacer layer.

DESCRIPTION

Figure 1:
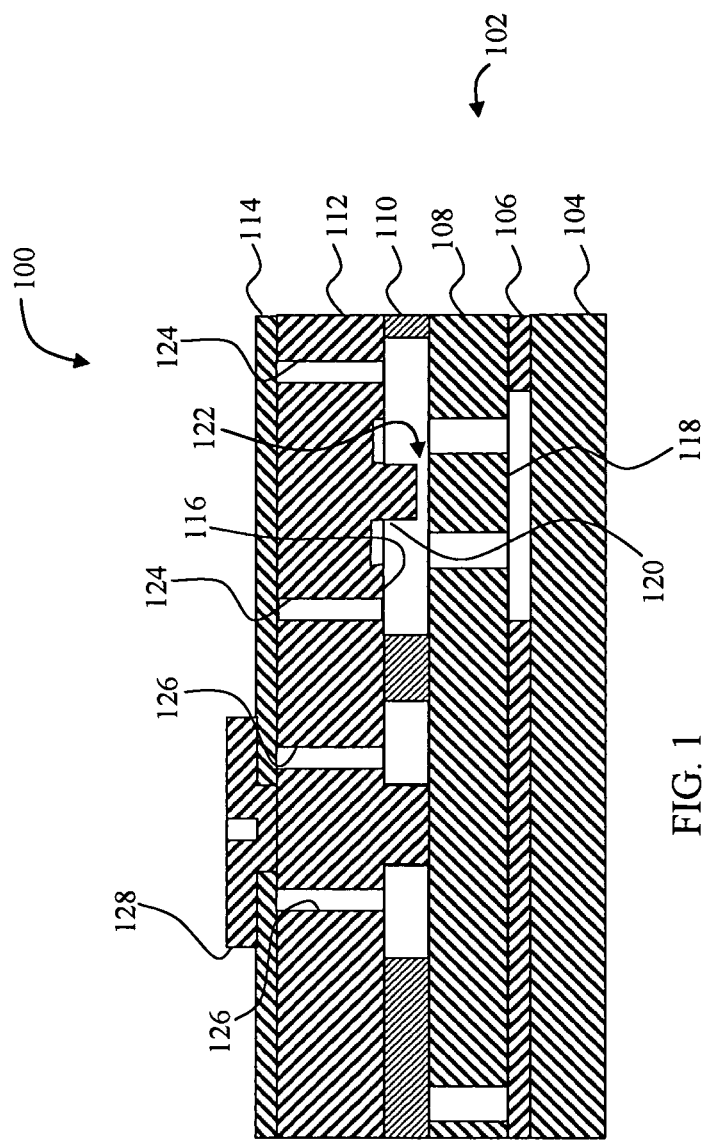
FIG. 1 depicts a side cross-sectional view of a wafer device with a gap between a Z-axis electrode and a resonator in accordance with principles of the present invention.

For the purposes of promoting an understanding of the principles of the invention, reference will now be made to the embodiments illustrated in the drawings and described in the following written specification. It is understood that no limitation to the scope of the invention is thereby intended. It is further understood that the present invention includes any alterations and modifications to the illustrated embodiments and includes further applications of the principles of the invention as would normally occur to one skilled in the art to which this invention pertains.

FIG. 1 depicts a side cross-sectional view of a wafer device 100. The wafer device 100 includes a substrate 102, which, in this embodiment, is a silicon on insulator (SOI) substrate. The substrate 102 includes an SOI handle layer 104, a buried oxide layer 106 and an SOI functional layer 108. A sacrificial oxide layer 110 is located above the functional layer 108 followed by an epitaxial encapsulation layer 112 and an oxide layer 114.

A chamber 116 extends from the sacrificial oxide layer 110 through the functional layer 108 and into the buried oxide layer 106. A resonator 118 is located within the chamber 116 and is formed in the functional layer 108. A Z-axis electrode 120 is located above the resonator 118 and separated from the resonator 118 by a gap 122. Trenches 124 extend through the encapsulation layer 112 to electrically isolate the Z-axis electrode 120 and trenches 126 extend through the encapsulation layer 112 to electrically isolate an electrical contact 128 which extends through the oxide layer 114.

Figure 2:
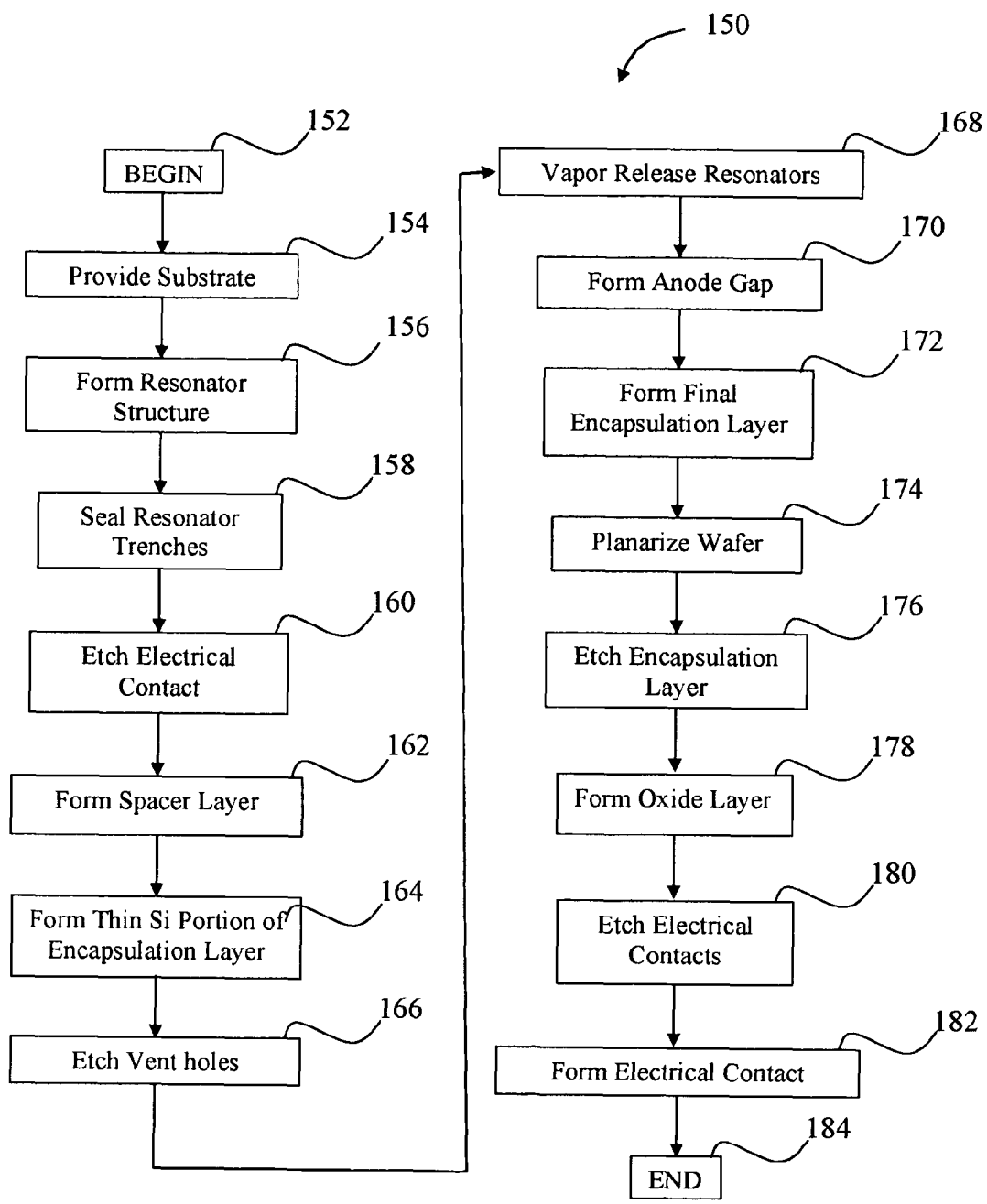
FIG. 2 depicts a flow chart of a process for manufacturing a device with a gap between a Z-axis electrode and a resonator in accordance with principles of the present invention.

FIG. 2 shows a flow chart 150 of a manufacturing process that may be used to produce the wafer device 100. The process 150 of FIG. 2 begins (block 152) and a substrate is provided (block 154). A photomask defining a resonator structure is then used to form the resonator structure (block 156). Once formed, the resonator structures are sealed with a sacrificial oxide layer (block 158). Electrical contacts and electrode contacts are then etched into the seal layer (block 160). A spacer layer is formed on the electrode contact (block 162) and a first portion of an encapsulation layer, which in this embodiment is a thin silicon layer, is formed over the seal layer (block 164). Vent holes are etched through the thin silicon layer (block 166) and a vapor phase hydrofluoric acid (HF) is used to etch the sacrificial oxide layer to release the resonator structure (block 168). The vapor phase etch further etches the spacer layer to provide a gap between the electrode structure and the resonator (block 170).

The second portion of the encapsulation layer is formed (block 172) which closes the vents and provides structural stability, and the top surface of the encapsulation layer is planarized using chemical mechanical polishing (CMP) (block 174). The planarized surface is etched to provide trenches which define isolated pillars of silicon for electrical throughputs (block 176). An oxide layer, deposited on the wafer to close the trenches (block 178), is etched to define electrical contacts (block 180) and the electrical contact is then formed (block 182). The process then ends (block 184).

Figure 3:
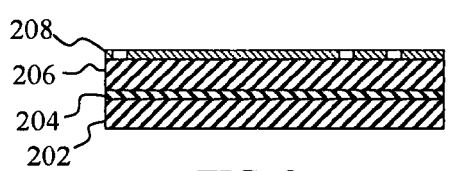
FIG. 3 depicts a cross-sectional view of a substrate, which in this embodiment is a silicon on insulator (SOI) substrate, with a photomask, which may be used in a device in accordance with principles of the present invention.
Figure 4:
FIG. 4 depicts a cross-sectional view of the substrate of FIG. 3 with trenches formed in the functional layer of the substrate.
Figure 5:
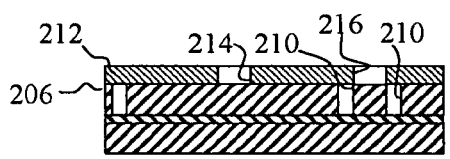
FIG. 5 depicts a cross-sectional view of the substrate of FIG. 4 with the trenches sealed with a sacrificial layer and holes for defining an electrical contact and an electrode formed in the sacrificial layer.
Figure 6:
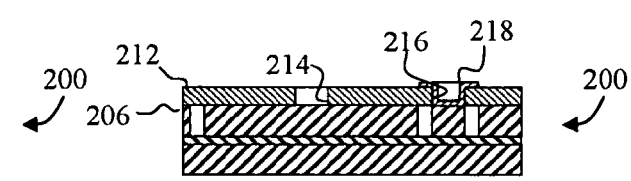
FIG. 6 depicts a cross-sectional view of the substrate of FIG. 5 with a spacer layer formed on a portion of the functional layer which was exposed through the sacrificial layer.
Figure 7:
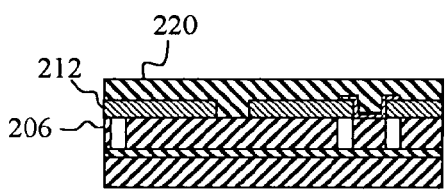
FIG. 7 depicts a cross-sectional view of the substrate of FIG. 6 with a thin portion of an encapsulating layer formed over the sacrificial layer and the spacer layer.

One example of the process of FIG. 2 is shown in FIGS. 3-12. A substrate 200 is shown in FIG. 3. The substrate 200 in this embodiment is a silicon on insulator (SOI) substrate including an SOI handle layer 202, a buried silicon dioxide layer 204 and a functional SOI layer 206. A photomask 208 is formed on the exposed upper surface of the SOI active layer 206. Deep reactive ion etching (DRIE) of the substrate 200 creates trenches 210 which define an unreleased resonator in the functional SOI layer 206. Next, a sacrificial layer 212 of LPCVD oxide is used to seal the trenches 210 and an electrical contact hole 214 and a Z-axis electrode hole 216 are etched into the sacrificial layer 212 as shown in FIG. 5.

Figure 8:
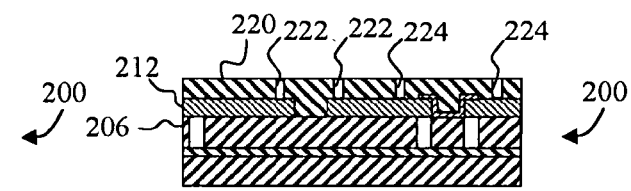
FIG. 8 depicts a cross-sectional view of the substrate of FIG. 7 with vent holes formed in the thin portion of the encapsulation layer.
Figure 9:
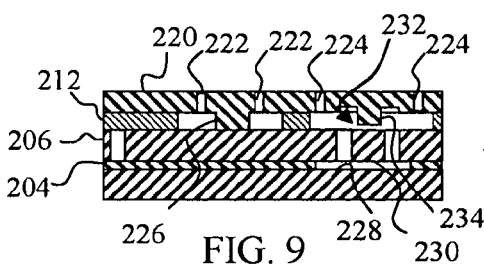
FIG. 9 depicts a cross-sectional view of the substrate of FIG. 8 after vapor etching has been used to define the electrical contact, to provide a gap between the electrode and the resonator structure, and to release the resonator structure.

A spacer layer 218 is then formed in the Z-axis electrode hole 216 (FIG. 6) and a first portion 220 of a silicon encapsulation layer is deposited on the sacrificial layer 212. In one embodiment, the first portion 220 is about 2 microns in depth. Vent holes 222 and vent holes 224 are etched through the first portion 220 as shown in FIG. 8. Vapor-phase HF is used to etch the sacrificial layer 212 located adjacent to the vent holes 222 and 224. Etching of the sacrificial layer 212 adjacent to the vent holes 222 defines an electrical contact 226 in the first portion 220. Etching of the sacrificial layer 212 adjacent to the vent holes 224 exposes some of the trenches 210 allowing the etch vapor to contact and etch the buried silicon dioxide layer 204, thereby forming a chamber 228 and to release the resonator structure 230 as shown in FIG. 9. The vapor-phase HF further etches the spacer layer 218 creating a gap 232 between the Z-axis electrode 234 and the resonator 230.

Figure 10:
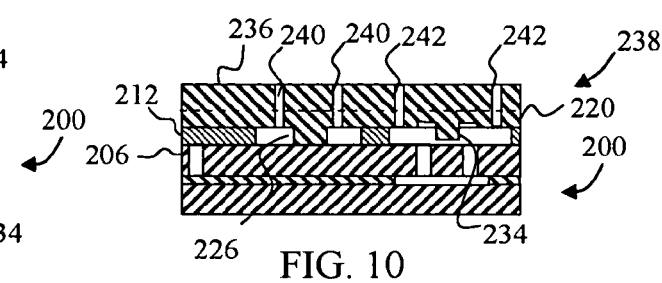
FIG. 10 depicts a cross-sectional view of the substrate of FIG. 9 after the remaining portion of the encapsulation layer has been formed and vent holes have been etched through the encapsulation layer.

A second portion 236 of the silicon encapsulation layer 238 is deposited on top of the first portion 220 and vent holes 240 and 242 are etched through the encapsulation layer 238 (see FIG. 10). The vent holes 240 electrically isolate the electrical contact 226 and the vent holes 242 electrically isolate the Z-axis electrode 234. The vent holes 242 also expose the chamber 228 to the environment above the encapsulation layer 238. Accordingly, the environment above the encapsulation layer 238 may be modified to result in a desired pressure within the chamber 228.

Figure 11:
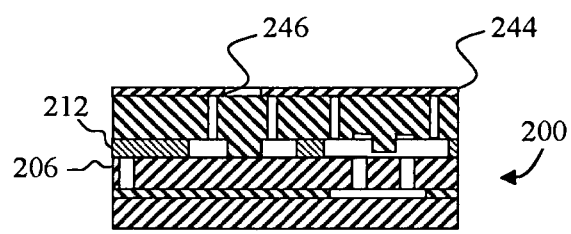
FIG. 11 depicts a cross-sectional view of the substrate of FIG. 10 with an oxide layer defining an electrical contact hole formed above the encapsulating layer.
Figure 12:
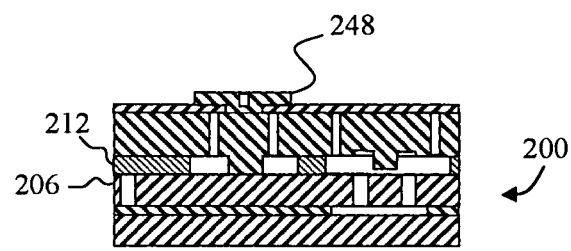
FIG. 12 depicts a cross-sectional view of the substrate of FIG. 11 with an electrical contact formed in the electrical contact hole of the oxide layer.

The vent holes 240 and 242 are then closed with an oxide layer 244 and an electrical contact hole 246 is etched through the oxide layer 244 (see FIG. 11). As shown in FIG. 12, an electrical contact 248, which in one embodiment is formed from aluminum, is formed in the electrical contact hole 246.

The processes and devices described above may be modified in a number of ways to provide devices for different applications including, but not limited to inertial sensing, shear stress sensing, in-plane force sensing, etc. By way of example, additional chambers may be provided on a single substrate 200. By selective deposition of one or more spacer layers, gaps of different widths may be realized between electrodes and resonators in the chambers to provide structures of different sensitivity within a wafer. Additionally, the thickness of the encapsulation lay may be selectively increased (decreased) over the entire wafer or over particular electrodes to provide stiffer structures.

While the invention has been illustrated and described in detail in the drawings and foregoing description, the same should be considered as illustrative and not restrictive in character. It is understood that only the preferred embodiments have been presented and that all changes, modifications and further applications that come within the spirit of the invention are desired to be protected.

The invention claimed is:

1. A method of forming a device with a controlled electrode gap width, comprising:
providing a substrate;
forming a functional layer on top of a surface of the substrate;
defining a movable member in the functional layer;
forming a sacrificial layer above the functional layer;
exposing a first portion of a top surface of the functional layer through the sacrificial layer;
forming a first spacer layer on the exposed first portion of the functional layer;
forming an encapsulation layer above the first spacer layer; and
vapor etching the encapsulated first spacer layer to form a first gap between the functional layer and the encapsulation layer.

2. The method of claim 1, wherein:
the movable member is a resonator structure; and
exposing a first portion of the functional layer comprises exposing a portion of the resonator structure.

3. The method of claim 2, wherein vapor etching the encapsulated spacer layer comprises:
vapor etching a portion of the sacrificial layer.

4. The method of claim 1, further comprising:
exposing a second portion of the functional layer through the sacrificial layer;
forming a second spacer layer on the exposed second portion of the functional layer;
forming the encapsulation layer above the second spacer layer; and
vapor etching the encapsulated second spacer layer to form a second gap between the functional layer and the encapsulation layer.

5. The method of claim 4, wherein the first spacer layer has a width for forming the first gap that is greater than a width of the second spacer layer for forming the second gap.

6. A method of forming a device with a controlled electrode gap width, comprising:
providing a substrate;
forming a functional layer on top of a surface of the substrate;
defining a movable member in the functional layer;
forming a sacrificial layer above the functional layer;
exposing a first portion of a top surface of the functional layer through the sacrificial layer;
forming a first spacer layer on the exposed first portion of the functional layer;
forming an encapsulation layer above the first spacer layer;
vapor etching the encapsulated first spacer layer to form a first gap between the functional layer and the encapsulation layer exposing a second portion of the functional layer through the sacrificial layer;
forming a second spacer layer on the exposed second portion of the functional layer;
forming a third spacer layer on the second spacer layer;
forming the encapsulation layer above the second spacer layer and the third spacer layer; and
vapor etching the encapsulated second spacer layer and the encapsulated third spacer layer to form a second gap between the functional layer and the encapsulation layer.

7. A method of forming a device with a z-axis electrode, comprising:
providing a substrate;
forming a functional layer on top of a surface of the substrate;
defining a movable member in the functional layer;
forming a sacrificial layer above the functional layer;
etching a first electrode hole in the sacrificial layer directly above a portion of the functional layer;
forming a first spacer layer within the first electrode hole;
forming a first encapsulation layer portion above the sacrificial layer and above the first spacer layer; and
removing the encapsulated first spacer layer.

8. The method of claim 7, further comprising:
forming at least one vent hole through the first encapsulation layer portion, wherein removing the encapsulated spacer layer further comprises:
vapor etching the spacer layer through the at least one vent hole.

9. The method of claim 7, further comprising:
forming a second encapsulation layer portion above the sacrificial layer.

10. The method of claim 7, further comprising:
forming at least one vent hole through the first encapsulation layer portion, wherein removing the encapsulated spacer layer further comprises:
vapor etching the spacer layer through the at least one vent hole.

11. The method of claim 7, further comprising:
etching a second electrode hole in the sacrificial layer;
forming a second spacer layer within the second electrode hole;
forming the first encapsulation layer portion above the second spacer layer; and
removing the encapsulated second spacer layer.

12. The method of claim 11, wherein the first spacer layer has a width for forming the first gap that is greater than a width of the second spacer layer for forming the second gap.

13. The method of claim 7, wherein:
the movable member is a resonator structure; and
etching a first electrode hole comprises exposing a portion of the resonator structure.

14. The method of claim 13, wherein removing the encapsulated first spacer layer comprises:
removing a portion of the sacrificial layer.

15. A method of forming a device with a z-axis electrode, comprising:
providing a substrate;
forming a functional layer on top of a surface of the substrate;
defining a first movable member in the functional layer;
forming a sacrificial layer above the defined movable member;
etching a first electrode hole in the sacrificial layer to expose an upper surface of the defined first movable member;
forming a first spacer layer within the first electrode hole;
forming a first encapsulation layer portion above the sacrificial layer and above the first spacer layer; and
removing the encapsulated first spacer layer.

16. The method of claim 15, further comprising:
forming a second encapsulation layer portion above the sacrificial layer.

17. The method of claim 15, further comprising:
defining a second movable member in the functional layer;
etching a second electrode hole in the sacrificial layer to expose an upper surface of the defined second movable member;
forming a second spacer layer within the second electrode hole;
forming the first encapsulation layer portion above the second spacer layer; and
removing the encapsulated second spacer layer.

18. The method of claim 17, wherein the first spacer layer has a width for forming the first gap that is greater than a width of the second spacer layer for forming the second gap.

19. The method of claim 15, wherein:
defining a first movable member comprises defining a resonator structure.

20. The method of claim 19, wherein removing the encapsulated first spacer layer comprises:
removing a portion of the sacrificial layer.

* * * * *